US012669549B2

(12) United States Patent
Lesso et al.

(10) Patent No.: US 12,669,549 B2
(45) Date of Patent: Jun. 30, 2026

(54) ELECTROCHEMICAL CELL CHARACTERISATION

(71) Applicant: Cirrus Logic International Semiconductor Ltd., Edinburgh (GB)

(72) Inventors: John P. Lesso, Edinburgh (GB); Toru Ido, Tokyo (JP); Yanto Suryono, Tokyo (JP)

(73) Assignee: Cirrus Logic Inc., Austin, TX (US)

( * ) Notice: Subject to any disclaimer, the term of this patent is extended or adjusted under 35 U.S.C. 154(b) by 490 days.

(21) Appl. No.: 18/453,660

(22) Filed: Aug. 22, 2023

(65) Prior Publication Data

US 2024/0125864 A1     Apr. 18, 2024

Related U.S. Application Data

(60) Provisional application No. 63/413,773, filed on Oct. 6, 2022.

(30) Foreign Application Priority Data

Oct. 31, 2022     (GB) ..................................... 2216079

(51) Int. Cl.
    *G01R 31/389*        (2019.01)
    *G01R 31/36*         (2020.01)
    *G01R 31/3835*       (2019.01)
(52) U.S. Cl.
    CPC ....... *G01R 31/389* (2019.01); *G01R 31/3648* (2013.01); *G01R 31/3835* (2019.01)
(58) Field of Classification Search
    CPC .............. G01R 31/389; G01R 31/3648; G01R 31/3835; G01R 27/26; G01R 27/02; G01N 27/028; G01N 27/26
    See application file for complete search history.

(56) References Cited

U.S. PATENT DOCUMENTS 9,244,130 B2    1/2016  Morrison et al.
2004/0128088 A1*  7/2004  Laletin ................. G01R 31/385
                                                    702/64

(Continued)

FOREIGN PATENT DOCUMENTS

WO        2020223630 A1    11/2020

OTHER PUBLICATIONS

Search Report under Section 17(6), UKIPO, Application No. GB2216079.0, mailed Nov. 29, 2023.

(Continued)

*Primary Examiner* — Walter L Lindsay, Jr.
*Assistant Examiner* — Geoffrey T Evans
(74) *Attorney, Agent, or Firm* — Jackson Walker L.L.P.

(57)            ABSTRACT

Circuitry for determining an impedance of an electrochemical cell comprising at least one first electrode and a second electrode, the circuitry comprising: drive circuitry configured to apply a stimulus to the electrochemical cell, the stimulus having a stimulation frequency and a stimulation amplitude; and measurement circuitry configured to: sample an output of the electrochemical cell at a sampling frequency to generate an output signal; determine an output amplitude of output signal at one or more alias frequencies, the one or more alias frequency based on the stimulation frequency and the sampling frequency; and determine the impedance of the cell at the stimulation frequency based on the output amplitude at the one or more alias frequencies and the stimulation amplitude; and control circuitry configured to: control the sampling frequency and the stimulation frequency such that a Nyquist rate of the sampling frequency is greater than stimulation frequency.

19 Claims, 7 Drawing Sheets

(56) References Cited

U.S. PATENT DOCUMENTS

| | | |
|---|---|---|
| 2017/0003355 A1 | 1/2017 | Ranieri et al. |
| 2017/0315076 A1 | 11/2017 | Morgan |

OTHER PUBLICATIONS

Combined Search and Examination Report under Sections 17 and 18(3), UKIPO, Application No. GB2216079.0, mailed May 3, 2023.

* cited by examiner

1100

ELECTROCHEMICAL CELL CHARACTERISATION

The present disclosure claims priority to U.S. Provisional Patent Application Ser. No. 63/413,773, filed Oct. 6, 2022, and United Kingdom Patent Application No. 2216079.0, filed Oct. 31, 2022, each of which is incorporated by reference herein in its entirety.

TECHNICAL FIELD

The present disclosure relates to circuitry for measuring characteristics in electrochemical sensors.

BACKGROUND

Electrochemical impedance spectroscopy (EIS) (also known as dielectric spectroscopy) is a known technique for characterising electrochemical systems, such as electrochemical cells. This technique measures the impedance of a system over a range of frequencies, and therefore a frequency response of the system. Properties of the system, including energy storage and dissipation properties, can be ascertained from this measured frequency response.

A traditional approach to EIS involves using a digital-to-analog converter (DAC) to drive a stimulus, typically a sine wave, into an electrochemical system and using an analog-to-digital converter (ADC) to measure a response to that stimulus. For an electrochemical sensor, the stimulus is typically a voltage, and the measured response is a current. For an electrochemical cell acting as a power source (i.e. a battery), the driving stimulus is typically a current, and the measured response a voltage. The frequency of the stimulus can be varied (e.g., swept) to obtain a response over a range of stimulation frequencies.

Characteristics of electrochemical cells are often ascertained from measured responses to high frequency stimulation (e.g., in excess of 1 MHz). However, driving a stimulus at such high frequencies comes with a cost of higher power and greater complexity associated with the DAC and ADC as well as associated amplifiers, feedback and/or feedback loops which may be incorporated into drive and measurement circuitry.

When such circuitry is battery powered, for example when an electrochemical sensor is integrated into a wearable device, it is desirable for the sensor to be as small as possible and use as little power as possible.

SUMMARY

Embodiments of the disclosure aim to address or at least ameliorate one or more of the above issues by providing novel circuitry for characterising electrochemical systems over a range of frequencies with reduced overall power consumption. In some embodiments, to reduce power consumption in an ADC used to digitize a measured response, an ADC sample rate may be chosen to be lower, in some example significantly lower than a frequency of a DAC used to drive a stimulus. In some embodiments, to reduce complexity of a DAC used to drive a stimulus, the stimulus used may be a square wave (instead of a conventional sine wave). In some embodiments, to relax requirements on the rise and fall times of such a square wave, a co-prime methodology may be implemented to select signal and sampling frequencies, as will be described in detail below.

According to a first aspect of the disclosure, there is provided circuitry for determining an impedance of an electrochemical cell comprising at least one first electrode and a second electrode, the circuitry comprising: drive circuitry configured to apply a stimulus to the electrochemical cell, the stimulus having a stimulation frequency and a stimulation amplitude; and measurement circuitry configured to: sample an output of the electrochemical cell at a sampling frequency to generate an output signal; determine an output amplitude of output signal at one or more alias frequencies, the one or more alias frequency based on the stimulation frequency and the sampling frequency; and determine the impedance of the cell at the stimulation frequency based on the output amplitude at the one or more alias frequencies and the stimulation amplitude; and control circuitry configured to: control the sampling frequency and the stimulation frequency such that a Nyquist rate of the sampling frequency is greater than stimulation frequency.

The drive circuitry may comprise a digital-to-analog converter (DAC) configured to convert a digital input signal into the stimulus at a conversion frequency; and apply the stimulus at the second electrode of the electrochemical cell.

The measurement circuitry may comprise an analog-to-digital converter (ADC) configured to sample the output of the electrochemical cell at the at least one first electrode. The DAC and the ADC may be synchronised.

With the DAC clocked by a first clock signal at the conversion frequency and the ADC clocked by a second clock signal at the sampling frequency, a first frequency of the first clock signal may be an integer multiple of a second frequency of the second clock signal.

The stimulus may comprises a square wave or triangle wave.

The control circuitry may be configured to control the sampling frequency based on the digital input signal or the stimulus. The control circuitry may be configured to control the digital input signal or the stimulus based on the sampling frequency.

The control circuitry may be configured to control the stimulation frequency and the sampling frequency so as to reduce aliasing of one or more harmonic components of the digital output signal onto a fundamental component of the digital output signal. The control circuitry may be configured to vary the stimulation frequency and sampling frequency over time to reduce aliasing of the one or more harmonic components of the digital output signal onto a fundamental component of the digital output signal. The control circuitry may be configured to control the stimulation frequency and the sampling frequency to maintain a greatest common denominator of the stimulation frequency of the analog measurement stimulus and the sampling rate at approximately 1. The control circuitry may be configured to control the stimulation frequency and the sampling frequency to be approximately co-prime.

The control circuitry may be configured to vary the stimulation frequency over a first range of frequencies below the Nyquist rate of the sampling frequency, wherein the measurement circuitry is configured to determine the output amplitude of the output signal at one or more frequencies unaffected by aliasing.

The control circuitry may be configured to vary the stimulation frequency and the sampling frequency over time to minimize an impact of harmonic aliasing at a predefined aliasing frequency.

The at least one first electrode may be a working electrode, and the second electrode may be a counter electrode.

The circuitry may further comprise a transimpedance amplifier (TIA) configured to convert a first electrode current at the at least one first electrode into a first electrode voltage. The TIA may comprise a TIA non-inverting input coupled to the at least one first electrode, a TIA inverting input coupled to a reference voltage, and a TIA output; and a feedback resistor coupled between the TIA output and the TIA non-inverting input.

The electrochemical cell may further comprise a reference electrode. In which case, the circuitry may comprise an input amplifier having a non-inverting input for receiving the stimulus; an inverting input coupled to the reference electrode; and an output for outputting a difference signal to the second electrode, the difference signal proportional to a difference between the stimulus and a reference voltage at the reference electrode.

The circuitry may further comprise an input amplifier having: a non-inverting input for receiving the stimulus; an inverting input coupled to the counter electrode; and an amplifier output for outputting a difference signal to the second electrode, the difference signal proportional to a difference between the stimulus and a counter voltage at the counter electrode.

The at least one first electrode may comprise an anode and the second electrode comprises a cathode. The Circuitry may further comprise a voltage controlled current source coupled between the at least one first electrode and the second electrode of the electrochemical cell, the voltage controlled current source configured to generate a stimulation current based on the stimulus.

The second electrode may be coupled to a reference voltage, the output of the electrochemical cell proportional to a voltage drop across the electrochemical cell.

According to another aspect of the disclosure, there is provided circuitry for measuring a characteristic of an electrochemical cell, the electrochemical cell comprising at least one first electrode and a second electrode, the circuitry comprising: a digital-to-analog converter (DAC) configured to convert a digital input signal into an analog measurement stimulus at a conversion frequency, and to apply the measurement stimulus at the second electrode of the electrochemical cell, the measurement stimulus oscillating at a stimulation frequency; an analog-to-digital converter (ADC) configured to convert a first electrode signal derived from the at least one first electrode into a digital output signal at a sampling frequency, and control circuitry configured to control the sampling frequency to be lower than the stimulation frequency of the measurement stimulus.

According to another aspect of the disclosure, there is provided a system comprising: the circuitry described above and the electrochemical cell.

According to another aspect of the disclosure, there is provided an electronic device, comprising the circuitry or the system described above. The device may comprise a continuous glucose monitor or a continuous analyte monitor or a continuous glucose/analyte sensor.

The electronic device may comprise a battery or a battery monitor or a battery management device or system.

The device may comprise one of a mobile computing device, a laptop computer, a tablet computer, a games console, a remote control device, a home automation controller or a domestic appliance, a toy, a robot, an audio player, a video player, or a mobile telephone, and a smartphone.

:the circuitry described above and the electrochemical cell.

According to another aspect of the disclosure, there is provided a method of determining an impedance of an electrochemical cell comprising at least one first electrode and a second electrode, the method comprising: applying a stimulus to the electrochemical cell, the stimulus having a stimulation frequency and a stimulation amplitude; sampling an output of the electrochemical cell at a sampling frequency and generate an output signal, a Nyquist rate of the sampling frequency being greater than the stimulation frequency; determining an output amplitude of output signal at one or more alias frequencies, the one or more alias frequency based on the stimulation frequency and the sampling frequency; and determining the impedance of the cell at the stimulation frequency based on the output amplitude at the one or more alias frequencies and the stimulation amplitude.

According to another aspect of the disclosure, there is provided a method of measuring a characteristic of an electrochemical cell, the electrochemical cell comprising at least one first electrode and a second electrode, the method comprising: converting a digital input signal into an analog measurement stimulus at a conversion frequency; applying the measurement stimulus at the second electrode of the electrochemical cell, the measurement stimulus oscillating at a stimulation frequency; converting a first electrode signal derived from the at least one first electrode into a digital output signal at a sampling frequency, and controlling the sampling frequency to be lower than the stimulation frequency of the measurement stimulus.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Electrochemical sensors are widely used for the detection of one or more particular chemical species, analytes, as an oxidation or reduction current. Such sensors comprise an electrochemical cell, consisting of two or more electrodes configured for contact with an analyte whose concentration is to be ascertained. Such sensors also comprise circuitry for driving one or more of the electrodes and for measuring a response at one or more of the electrodes. Batteries also comprise one or more electrochemical cells which typically consist of two or more electrodes (e.g., an anode and a cathode) configured for contact with a conductive electrolyte. Characteristics of batteries may be ascertained using a drive and measurement circuitry similar to that used for characterising electrochemical cells in electrochemical sensors.

Embodiments of the present disclosure provide various novel drive and measurement regimes for characterising electrochemical cells and systems (such as sensors, batteries and the like) into which electrochemical cells are incorporated.

Figures 1, 2:
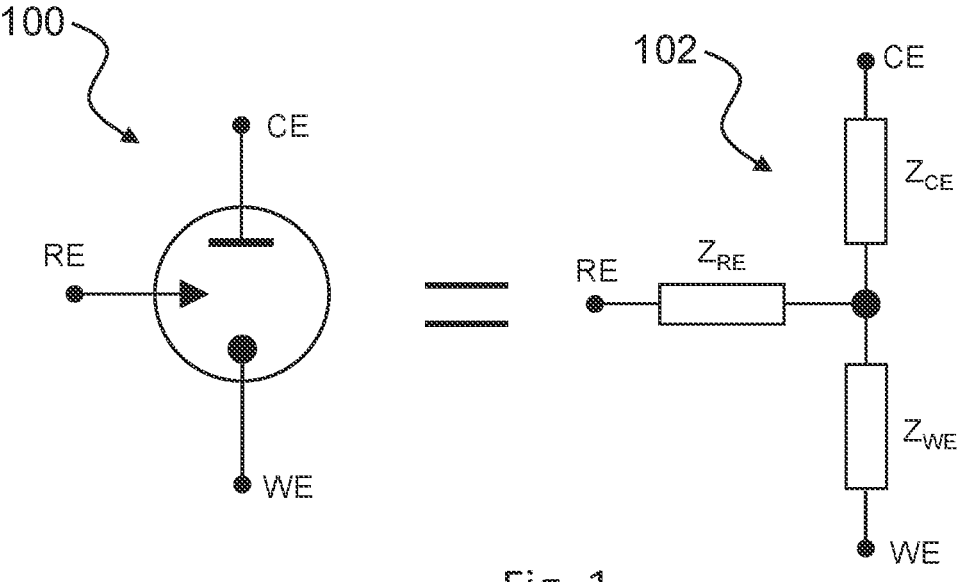
FIG. 1 illustrates a schematic diagram and electrical equivalent circuit for a three-electrode electrochemical cell.
FIG. 2 is a schematic diagram of an example prior art measurement circuit.

FIG. 1 is a schematic diagram of an example electrochemical cell 100 comprising three electrodes, namely a counter electrode CE, a working electrode WE and a reference electrode RE. FIG. 1 also shows an equivalent circuit 102 for the electrochemical cell comprising a counter electrode impedance ZCE, a working electrode impedance ZWE and a reference electrode impedance ZRE. Embodiments of the disclosure will be described with reference to this example electrochemical cell 100. It will be appreciated, however, that the techniques and apparatus described herein may be used in conjunction with any conceivable electrochemical system, including but not limited to two-electrode electrochemical cells (e.g., cells comprising a counter electrode CE and a working electrode WE and no reference electrode), or electrochemical cells with more than three electrodes. Electrodes of the electrochemical cells described herein may also be referred to as anodes and/or cathodes as is conventional in the field of electrical batteries.

To determine a characteristic of the electrochemical cell 100, and therefore an analyte concentration, a bias voltage is applied at the counter electrode CE and a current at the working electrode WE is measured. The reference electrode RE is used to measure a voltage drop between the working electrode WE and the reference electrode RE. The bias voltage is then adjusted to maintain the voltage drop between RE and WE constant. As the resistance in the cell 100 increases, the current measured at the working electrode WE decreases. Likewise, as the resistance in the cell 100 decreases, the current measured at the working electrode WE increases. Thus the electrochemical cell 100 reaches a state of equilibrium where the voltage drop between the reference electrode RE and the working electrode WE is maintained constant. Since the bias voltage at the counter electrode CE and the measured current at WE are known, the resistance of the cell 100 can be ascertained.

FIG. 2 illustrates an example prior art drive and measurement circuit 200 which is configured to implement the above explained cell characterisation, specifically for measuring an analyte concentration in the electrochemical cell 100 shown in FIG. 1. The circuit 200 comprises a first amplifier 202 and a second amplifier 204. Each of the first and second amplifiers 202, 204 may comprise one or more op-amps. A non-inverting input of the first amplifier 202 is coupled to a bias voltage VBIAS which may be generated by a digital-to-analog converter DAC (not shown). An inverting input of the first amplifier 202 is coupled to the reference electrode RE. An output of the first amplifier 202 is coupled to the counter electrode CE and configured to drive the counter electrode CE with a counter electrode bias voltage VCE. The counter electrode bias voltage VCE applied at the counter electrode CE by the first amplifier 202 is proportional to the difference between the bias voltage VBIAS and the voltage VRE at the reference electrode RE. As such, the first amplifier 202 acts to maintain the voltage between the reference electrode RE and the working electrode WE at the bias voltage VBIAS. An inverting input of the second amplifier 204 is coupled to the working electrode WE and a non-inverting input of the second amplifier 204 is coupled to a fixed reference voltage, in this case ground GND. A feedback resistor RF is coupled between the non-inverting input and an output of the second amplifier 204. As such, the second amplifier 204 may operate as a transimpedance amplifier. The second amplifier 204 is thus operable to output a voltage VO which is proportional to the current IWE at the working electrode WE. The output voltage VO is then provided to an analog-to-digital converter (ADC) 206 which outputs a digital output Q which represents the current IWE at the working electrode WE.

To bias the counter electrode CE, and therefore the electrochemical cell 100, at different voltages, the bias voltage VBIAS may be adjusted. The bias voltage VBIAS may be adjusted between a reference voltage (e.g. ground or zero volts) and the supply voltage VDD. With the non-inverting input of the second amplifier 204 set at VDD/2, a positive bias may be applied to the cell 100 by maintaining the bias voltage VBIAS above VDD/2. Likewise, a negative bias may be applied to the cell 100 by maintaining the bias voltage VBIAS below VDD/2.

The drive and measurement circuitry 200 described above may also be used to implement electrochemical impedance spectroscopy (EIS) on the cell. To do so, the bias voltage VBIAS may be modulated with a sine wave and the ADC 206 may be configured to measure a response of the cell 100 to that sine wave, in the form of the output voltage VO. The frequency of the sine wave may be adjusted over a range of frequencies in order to obtain a series of frequency dependent impedance measurements of the cell 100.

As noted above, certain characteristics of the electrochemical cell 100 may be ascertained by applying a stimulus at high frequency, such as frequencies in excess of 1 MHz. However, the higher the frequency of an applied EIS stimulus, the higher the power consumption and complexity of circuitry needed both for applying the stimulus and for measuring a response.

Figure 3:
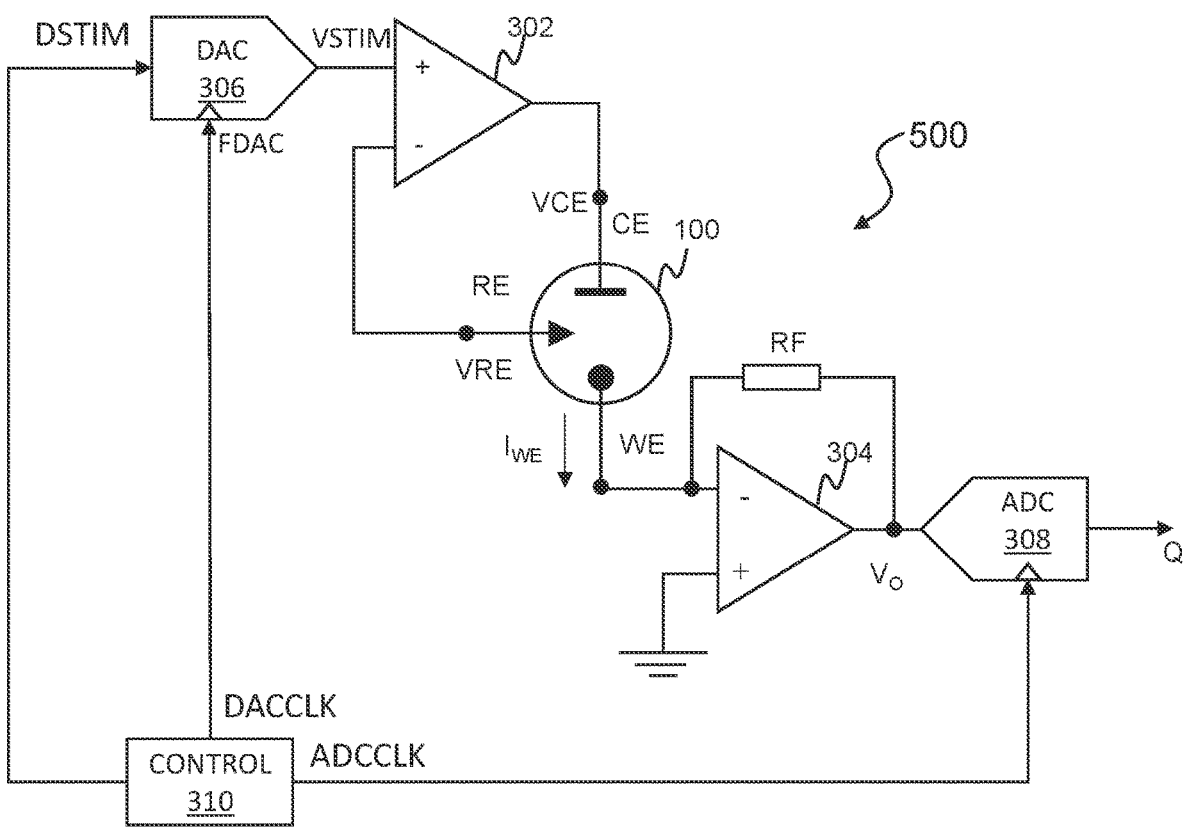
FIG. 3 is a schematic diagram of a drive and measurement circuit according to embodiments of the present disclosure.

FIG. 3 illustrates example drive and measurement circuitry 300 according to embodiments of the present disclosure, for measuring a characteristic of the electrochemical cell 100 using electrochemical impedance spectroscopy (EIS). The circuitry 200 comprises a first amplifier 302, a second amplifier 304, a DAC 306, an ADC 308 and a control module 310. Each of the first and second amplifiers 302, 304 may comprise one or more op-amps.

The circuitry 300 of FIG. 3 differs from that shown in FIG. 2 by the provision of the control module 310. The control module 310 is configured to generate a digital stimulation signal DSTIM, a DAC clock signal DACCLK and an ADC clock signal ADCCLK. Operation of the control module 310 will be described in detail below.

The DAC 306 is configured to generate a voltage stimulus VSTIM at its output based on the digital stimulation signal DSTIM received from the control module 310. The DAC 306 may convert the digital stimulation signal DSTIM to the voltage stimulus VSTIM at a conversion frequency FDAC controlled by the clock signal DACCLK, also received from the control module 310. It will be appreciated that the conversion frequency FDAC of the DAC 306 will need to be faster than the frequency of the digital stimulus DSTIM in order to accurately convert the digital stimulus DSTIM into the (analog) voltage stimulus VSTIM. As such, the control module 310 may be configured to maintain the conversion frequency FDAC of the DAC at at least the same frequency as the frequency of the digital stimulus DSTIM. In some embodiments, conversion in the DAC 306 may be synchronised with updates of the digital stimulus DSTIM.

As will be explained in more detail below, the voltage stimulus VSTIM may be a (pseudo) sine wave, a square wave, or other alternating signal having a stimulation frequency FSTIM. The voltage stimulus may be biased by a DC offset voltage bias VBIAS. The stimulation frequency FSTIM may vary over time. For example, the voltage stimulus VSTIM may be applied to the electrochemical cell 100 at multiple different point frequencies (e.g., applying a first stimulus at a first fixed amplitude and frequency, then applying a second stimulus at a second fixed amplitude and frequency and so on). The voltage stimulus VSTIM may be continuous, the stimulation frequency FSTIM being switched whilst the voltage stimulus VSTIM is applied to the cell 100. Alternatively, the voltage stimulus VSTIM may be disconnected from the cell 100 between frequency changes. In some embodiments, the voltage stimulus VSTIM may be applied as a chirp (i.e. a single stimulus varying in frequency either in steps or sweeping continuously over a predetermined frequency range).

In a variation of the circuitry 300 shown in FIG. 3, the DAC 306 may be omitted. In which case, control module 310 may be configured to generate the voltage stimulus VSTIM at the stimulation frequency FSTIM. In a further variation, the ADC 308 may be omitted or replaced with any conceivable alternative sampling circuitry.

As noted above, whilst in this embodiment a voltage stimulus VSTIM is applied, in other embodiments, a current stimulus may be applied, as will be described in more detail below.

The voltage stimulus VSTIM is provided to a non-inverting input of the first amplifier 302 which is coupled to the output of the DAC 306. An inverting input of the first amplifier 302 is coupled to the reference electrode RE of the cell 100. Where the reference electrode RE is omitted or the three-electrode cell 100 is replaced with a two-electrode cell, the inverting input of the first amplifier may be coupled to the counter electrode CE of the electrochemical cell 100 or two-electrode cell.

An output of the first amplifier 302 is coupled to the counter electrode CE and configured to drive the counter electrode CE with a counter electrode bias voltage VCE. The counter electrode bias voltage VCE applied at the counter electrode CE by the first amplifier 302 is proportional to a difference between the bias voltage VBIAS and the voltage VRE at the reference electrode RE. As such, the first amplifier 302 acts to maintain the voltage between the reference electrode RE and the working electrode WE at the bias voltage VBIAS. An inverting input of the second amplifier 304 is coupled to the working electrode WE and a non-inverting input of the second amplifier 304 is coupled to a fixed reference voltage, in this case ground. A feedback loop comprising a feedback resistor RF is coupled between the inverting input and an output of the second amplifier 304. As such, the second amplifier 304 may operate as a transimpedance amplifier. The second amplifier 304 is thus operable to output a voltage VO which is proportional to the current IWE at the working electrode WE. The output voltage VO is then provided to the analog-to-digital converter (ADC) 308.

The ADC 308 is configured to convert the output voltage VO to a digital output Q which represents the current IWE at the working electrode WE. With knowledge of the current IWE and the voltage stimulus VSTIM applied at the counter electrode CE, an impedance of the cell 100 can be determined at the frequency FSTIM of the voltage stimulus VSTIM. By varying the stimulation frequency FSTIM as described above, the impedance of the cell 100 at different stimulation frequencies can be ascertained. These multiple measurements can then be combined to generate an impedance spectrum for the cell 100.

The ADC 308 is configured to sample the output voltage VO at a sampling rate FADC based on the ADC clock signal ADC received from the control module 310. The control module 310 may be configured to control the DAC clock signal DACCLK and the ADC clock signal ADCCLK such that they differ by a multiple of k, where k is greater than 1. In doing so, the sampling rate FADC of the ADC 308 may be set to be k times lower than the sampling frequency FDAC of the DAC 306. In other words, the ADC 308 is configured to under sample the output voltage VO with respect to the stimulation frequency FSTIM of the voltage stimulus VSTIM.

Thus, the control module 310 may be configured to individually control the frequency FSTIM of digital stimulus DSTIM, the DAC clock signal DACCLK and the ADC clock signal ADCCLK so as to control the stimulation frequency FSTIM of the voltage stimulus VSTIM, the conversion frequency FDAC of the DAC 306 and the sampling frequency FADC of the ADC 308.

The inventors have realized that by careful choice of the DAC conversion frequency FDAC and the ADC sampling frequency FADC, the ADC sampling frequency FADC can be substantially reduced when compared to conventional techniques. For example, for a 1 MHz stimulus VSTIM, a traditional approach would be to use a sampling frequency FADC in the ADC 308 of 2 MHz. In embodiments of the present disclosure such as those described below, however, the sampling frequency FADC of the ADC 308 can be reduced to the kilohertz range, for example, 32.768 kHz. Since ADC power scales linearly with sampling frequency, the relative power reduction can be approximated as the ratio of the previous ADC sampling frequency (e.g., 2 MHz) and the revised ADC sampling frequency (e.g., 32.768 kHz). This reduction in ADC sampling frequency therefore yields a relative power reduction of over sixty times.

It is known in the art that when a sinewave or similar AC signal is applied to a data converter (such as an ADC or DAC), device nonlinearities produce harmonics which manifest in the signals output from such converters. For harmonics whose frequencies are greater than the Nyquist frequency (i.e. 0.5*sampling frequency of FADC), such harmonics will fold down, appearing as aliases in the baseband signal (e.g., at frequencies below the Nyquist frequency).

As mentioned above, by reducing the sampling frequency FADC of the ADC 308, the power consumption of the ADC 308 can be reduced. However, reducing the sampling frequency FADC of the ADC 308 also has the effect of increasing the number of harmonics with a frequency greater than the Nyquist frequency, and therefore the number of harmonics available for downsampling (i.e. folding back) into the baseband is also increased. In turn, such downsampling may lead to undesirable aliasing of lower frequency components of the output signal Q, causing undesirable error in the output signal Q.

To avoid or ameliorate such aliasing, the sampling frequency FADC of the ADC 308 and the stimulation frequency FSTIM of the stimulus VSTIM may be chosen so as to reduce or substantially eliminate instances of aliasing due to harmonics folding on top of fundamental frequency bands in the output signal Q. Such choice of sampling frequency FADC and stimulation frequency FSTIM will now be described.

Figure 4:
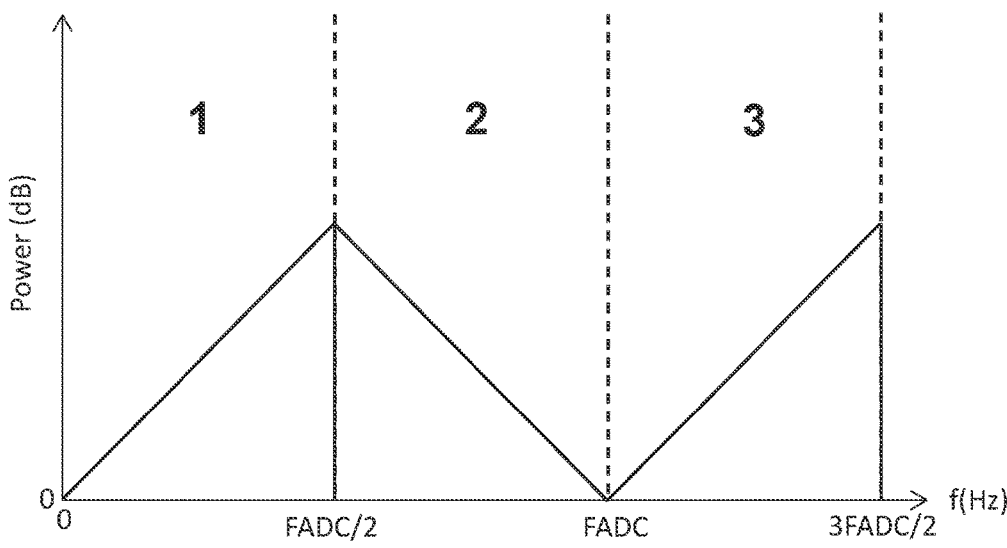
FIG. 4 is a graph shown folding frequencies for an analog-to-digital converter (ADC) of the measurement circuit of FIG. 3.

To determine an aliasing frequency FALIAS for a given stimulus VSTIM and sampling frequency FADC, odd and even aliasing regions should first be considered as shown in FIG. 4. Specifically, FIG. 4 shows a frequency vs power plot showing odd and even aliasing regions for a given output signal Q from the ADC 308 sampling at the ADC sampling rate FADC.

The folded or alias frequency FALIAS may be calculated for a given sampling frequency FADC and a given stimulation frequency FSTIM of the stimulus VSTIM. For example, a parity, n, of the stimulation frequency FSTIM may be determined using the following equation:

$$n = 1 + \left\lfloor \frac{FSTIM}{FADC/2} \right\rfloor$$

Depending on whether the parity n of the stimulation frequency FSTIM is odd or even, the aliasing frequency FALIAS may then be calculated using one of the following equations.

$$n \text{ odds}, FALIAS = \frac{FADC}{2} - \text{mod}\left(FADC, \frac{FSTIM}{2}\right)$$

$$n \text{ even}, FALIAS = \text{mod}\left(FADC, \frac{FSTIM}{2}\right)$$

The above may be exemplified for a given stimulation frequency FSTIM of 1 MHz and an ADC sampling frequency FADC of 32.768 kHz. The aliasing frequency FALIAS may be calculated as follows:

$$FSTIM = 1 \text{ MHz}$$

$$FADC = 32.768 \text{ kHz}$$

$$n = 62 \text{ (even)}$$

$$FALIAS = \text{mod}(32.768 \text{ kHz}, 500 \text{ kHz}) = 576 \text{ Hz}$$

To reduce the complexity of generation of the stimulus VSTIM (for example using the DAC 306 or other element should the DAC 306 be omitted), embodiments of the present disclosure may implement the stimulus VSTIM as a square wave (as opposed to a sine wave as is conventional in the art). It will, however, be appreciated that where the stimulus VSTIM is a square wave, harmonics will also be generated during conversion. Again, harmonics with a frequency greater than the Nyquist will fold down into the baseband of the output signal Q when converted by the ADC 308.

It will be understood that a square wave can be approximated as the sum of only odd harmonics of a sine wave. Thus, a square wave can be approximated using the following Fourier series for a sine wave of frequency FSTIM.

10

$$f(x) = \frac{4}{\pi} \sum_{n \text{ odd}}^{\infty} \frac{1}{n} \sin(2 * FSTIM * n\pi x)$$

As noted above, the stimulation frequency FSTIM may vary (step wise or swept) in order to develop a frequency dependent picture of the electrochemical cell 100. In doing so, the frequency bin into which each harmonic of the output signal will alias in the output signal Q will vary. For each of these frequencies, a determination may therefore be made regarding each of the harmonics folding down into the baseband.

For example, using the above process, the aliasing frequency FALIAS of each harmonic (including those associated with the square wave if used in place of a sine wave) may be ascertained. If any of the harmonics of the stimulus fold down in the output Q of the ADC 308 into the same frequency bin as the fundamental signal, then the amplitude of that frequency bin will be modified. Such modification will introduce error, in that the information concerning the fundamental signal (which may relate to the characteristics of the electrochemical cell 100) will be augmented.

It will be appreciated that it is not practical to consider harmonics at every conceivable frequency. As such, when considering a square wave as the stimulus VSTIM, it is practical to consider an effective 3 dB bandwidth of the frequency response of the stimulus VSTIM, which is inversely proportional to the rise time $t_{rise}$ of the output signal Q. This inverse relationship can be approximated by the following known equation:

$$f_{3db} \cong \frac{0.35}{t_{rise}}$$

The amplitude of the harmonics will be limited by the bandwidth of the output signal Q, which in turn is set by the rise time $t_{rise}$ of the input stimulus VSTIM. This bandwidth will also, therefore, vary with stimulation frequency FSTIM (in addition to other factors related to conversion in the DAC 306).

As noted above, aliasing of harmonics into the baseband may be detrimental to output signal quality due to associated error introduced. As such, it may be preferable to reduce or avoid any harmonic aliasing in frequency bands of the fundamental of the output signal Q. To achieve this, a relationship between the stimulus frequency FSTIM and the ADC sampling frequency FADC may be maintained so as to avoid harmonic aliasing.

To do so, in some embodiments, the control module 310 may be configured to control the sampling frequency FADC and the stimulation frequency FSTIM such that a Nyquist rate of the sampling frequency FADC is greater than stimulation frequency FSTIM. In other words, the stimulation frequency FSTIM may be maintained at a frequency of FADC/2 or less.

In addition or as an alternative to the above, the inventors have found that by maintaining the greatest common denominator between the stimulus frequency FSTIM and the ADC sampling frequency FADC as one ("1"), harmonic aliasing onto the fundamental (i.e. into the baseband) can be avoided or even substantially eliminated. That is to say:

$$gcd(FSTIM, FADC) = 1$$

In other words, the ratio between the stimulus frequency FSTIM and the ADC sampling frequency FADC may be maintained as follows:

$$FSTIM = \frac{n}{m} FADC$$

Where n and m are co-prime numbers, i.e. n and m are numbers that have their highest common factor (HCF) as one ("1").

The effect of maintaining the above ratio of stimulation frequency FSTIM and ADC sampling frequency FADC is illustrated in FIGS. 5 to 8.

Figure 5:
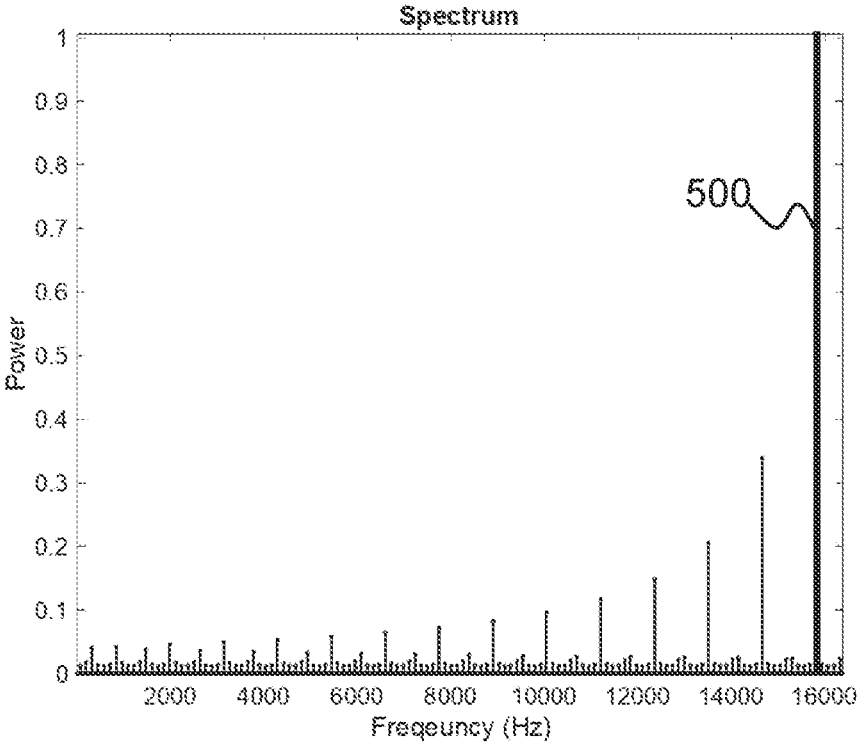
FIG. 5 is a frequency spectrum of a signal output from the ADC of FIG. 3.
Figure 6:
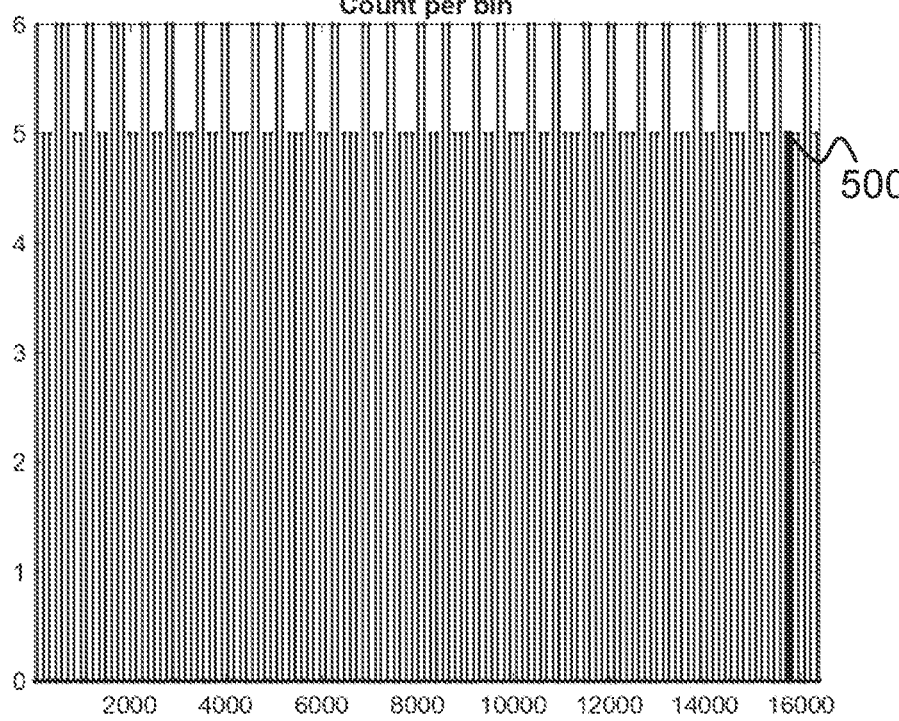
FIG. 6 is a plot showing count of aliased and non-aliased tones per frequency bin in the frequency spectrum of FIG. 5.

FIG. 5 shows a frequency response of the output signal Q responsive to an input stimulus VSTIM of frequency 1 MHz and an ADC sampling frequency FADC of the ADC 308 of 32.768 kHz. FIG. 6 is a graph showing a count of aliased and non-aliased tones per frequency bin for the same output signal Q. In this example, the sampling frequency FADC and the input stimulus frequency FSTIM are not co-prime. The frequency of the fundamental 500 is shown in each plot in bold. It can be seen that the frequency of the fundamental 500 contains more than one harmonic aliasing into it, in this example the fundamental 500 contains five aliased harmonics (tones).

Figure 7:
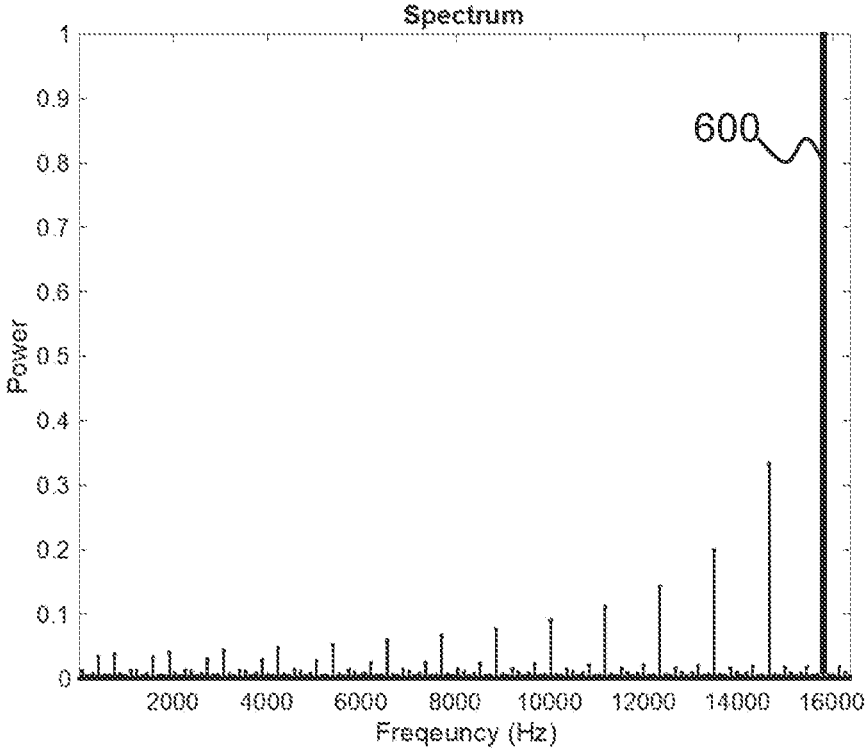
FIG. 7 is a frequency spectrum of a signal output from the ADC of FIG. 3.
Figure 8:
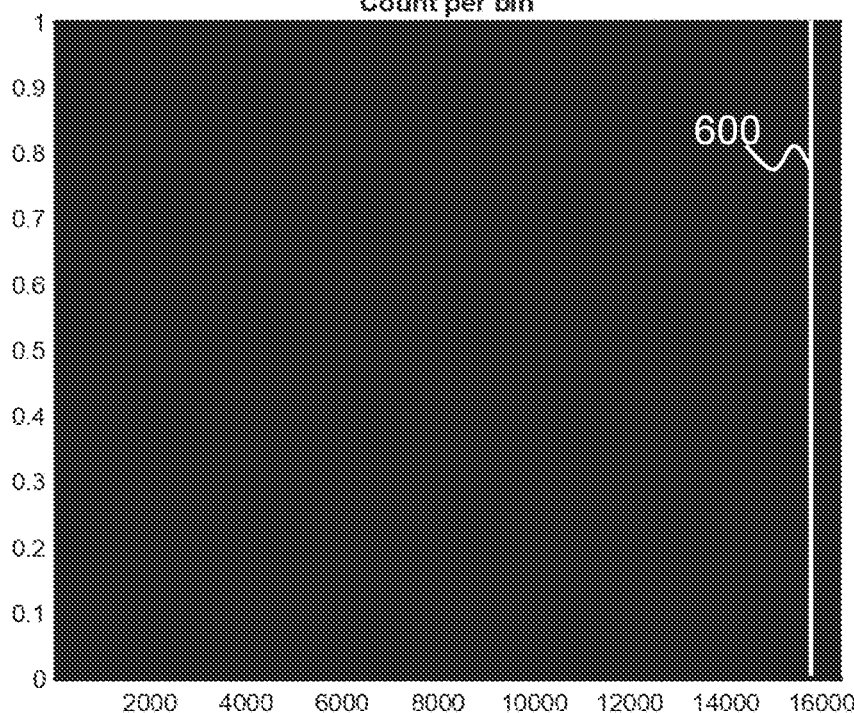
FIG. 8 is a plot showing count of aliased and non-aliased tones per frequency bin in the frequency spectrum of FIG. 7.

FIG. 7 shows a frequency response of the output signal Q response to an input stimulus VSTIM of frequency FTSIM 1 MHz+3 Hz (1000003 Hz) and the same ADC sampling frequency FADC of 32.768 kHz. FIG. 8 is a plot showing aliased and non-aliased tones per frequency bin for the same output signal Q. It can be seen that since the stimulus frequency FSTIM and sampling frequency FADC are now co-prime, only one tone exists per bin at the fundamental frequency 600.

As such, it can be seen that by maintaining the ratio of sampling frequency FADC to stimulation frequency FSTIM as above, harmonic aliasing on the fundamental frequency of the output signal Q can be avoided. In doing so, the sampling frequency FADC can be significantly reduced since the effective increase in harmonics in the output signal Q does not affect the fundamental, due to the avoidance or reduction of harmonic aliasing.

It will be appreciated that whilst it is preferable for the sampling frequency FADC and the stimulation frequency FSTIM to be co-prime, advantageous results may still be achieved by controlling the sampling frequency FADC and stimulation frequency FSTIM with a degree of tolerance away from an exactly co-prime relationship. For example, as the sampling frequency FADC and the stimulation frequency FSTIM become less co-prime, then instances of harmonics folding down onto the fundamental of the output signal Q will increase. In contrast, as the sampling frequency FADC and the stimulation frequency FSTIM become more co-prime, then instances of harmonics folding down onto the fundamental of the output signal Q will decrease. As such, the control module 310 may control the sampling frequency FADC and the simulation frequency FSTIM to maintain a relationship therebetween which reduces instances of aliasing of harmonics onto the fundamental in the output signal Q. The degree at which instances are reduced may depend, by way of non-limiting example, on the accuracy of measurements required by the circuitry 300 and the frequency of interest in the output signal Q.

An upper limit on the number of harmonics, $n_H$ will be set by the bandwidth BW of output signal Q which, as noted above, is inversely proportional to the rise time of the stimulus VSTIM. The number of harmonics $n_H$ may be defined by the following equation:

$$n_H = \left\lfloor \frac{BW}{FADC} \right\rfloor$$

It will be appreciated that whilst there is theoretically no lower limit for the sampling frequency FADC, to avoid aliasing between the fundamental and harmonics, a sufficient number of bins may be provided in the output signal Q. The narrower the bandwidth BW, the smaller the number of harmonics that need to be considered. In some embodiments, therefore, the ratio of the stimulus frequency FSTIM to the sampling frequency FADC may be maintained at an irreducible ratio (i.e. a ratio that cannot be simplified, e.g., ⅓). Maintaining this relationship between stimulus frequency FSTIM and the sampling frequency FADC will reduce the number of harmonics folding onto the fundamental in the output signal. Additionally or alternatively, a pragmatic lower limit of frequency bins may be set to approximately five times the number of harmonics in the output signal Q. For example, for each of the n H harmonics to fit into a unique 1 Hz bandwidth after aliasing, then the pragmatic lower limit $FADC_{LOW}$ on the ADC sampling frequency may be given by the following equation:

$$FADC_{LOW} = 5 * n_H$$

Referring again to FIG. 3, as noted above, by monitoring the amplitude of the fundamental (non-harmonic) component of the output signal Q, a determination can be made as to the impedance of the electrochemical cell 100 at a specific excitation frequency (i.e. FSTIM). The inventors have realised, however, that the harmonic content in the output signal Q may also be used to determine various characteristics of the cell 100.

For example, for a square wave stimulus of frequency FSTIM, harmonics occur at frequencies of FSTIM and n*FSTIM with an amplitude of 1/n, where n is an odd integer. Under co-prime conditions, i.e. where the stimulation frequency FSTIM and the sampling frequency FADC of the ADC 308 are co-prime, these harmonics each fall into a respective (different) frequency bin. As such, each harmonic may be used to characterise the electrochemical cell 100 at the frequency of the respective harmonic. In doing so, characterisation of the cell 100 at multiple frequencies can be achieved through stimulation with a stimulus VSTIM at a single stimulation frequency FSTIM.

As mentioned above, the control module 310 (in conjunction with the optional DAC 306) may generate the voltage stimulus VSTIM with a frequency FSTIM which may be applied to the cell 100. The response to the stimulus VSTIM from the cell 100 may be sampled to generate the output signal Q, which may be analysed to determine the amplitude of the fundamental M1 and the amplitude of each of the n harmonics.

The fundamental will fold down or alias to a frequency Fa1 and each of the n harmonics of the square wave will alias to a frequency Fan (where n=1 is the fundamental/first harmonic, n=2 is the second harmonic etc). The alias frequency Fan for each of the n harmonics may be calculated as the absolute value of the difference between the closest integer multiple of the sampling frequency FADC of the ADC and the stimulus frequency FSTEM, i.e.:

$$Fan = |mFADC - FSTIM|$$

Where m is an integer such that Fan<FADC.

The expected amplitude an at the alias frequency Fan may be given by:

$$a_n = \frac{2A}{n\pi}\sin(n\pi d)$$

Where A is the amplitude of the stimulus VSTIM, n is the order of the harmonic (i.e., n=1 for the fundamental, n=2 for the second harmonic etc.) and d is the duty cycle between 0 and 1. Hence, the transfer function $T_N$ may be given by the ratio of the measured amplitude Mn of the output signal Q at a given alias frequency Fan and the expected amplitude $a_n$ of the output signal Q at a given alias frequency, i.e.:

$$T_N = \frac{M_n}{a_n}$$

For the electrochemical cell 100, the above transfer function $T_N$ corresponds to the admittance of the cell 100. Hence, the above equation can be reformulated to express impedance of the cell 100 as shown below:

$$Z_N = \frac{a_n}{M_n}$$

Thus, the impedance of the cell 100 can be ascertained at a frequency of each harmonic tone in the output signal Q by providing the measured amplitude Mn of the output signal Q at its respective alias frequency. The number of harmonics which can be analysed will, however, be limited by the system bandwidth, as discussed in detail above.

It is noted that the above transfer function TN corresponds to the impedance of a power source (i.e. a battery) as will be explained in detail below.

It will be further appreciated that the duty cycle of the stimulus VSTIM, particularly when implemented as a square wave, may be varied in order to modify the distribution of harmonics. In doing so, the frequency at which harmonics occur can be varied, in addition to adding further harmonics (by reducing the spectral space between harmonics).

Referring to the above equation for expected amplitude a m of the m harmonics in the output signal Q, it will be appreciated that aliasing is independent of duty cycle. As long as the stimulation frequency FSTIM and the ADC sampling frequency FADC are co-prime, there will be no aliasing into the same bin as a fundamental. As such, the duty cycle can be varied to vary the distribution of harmonics in the output signal Q.

Figure 9:
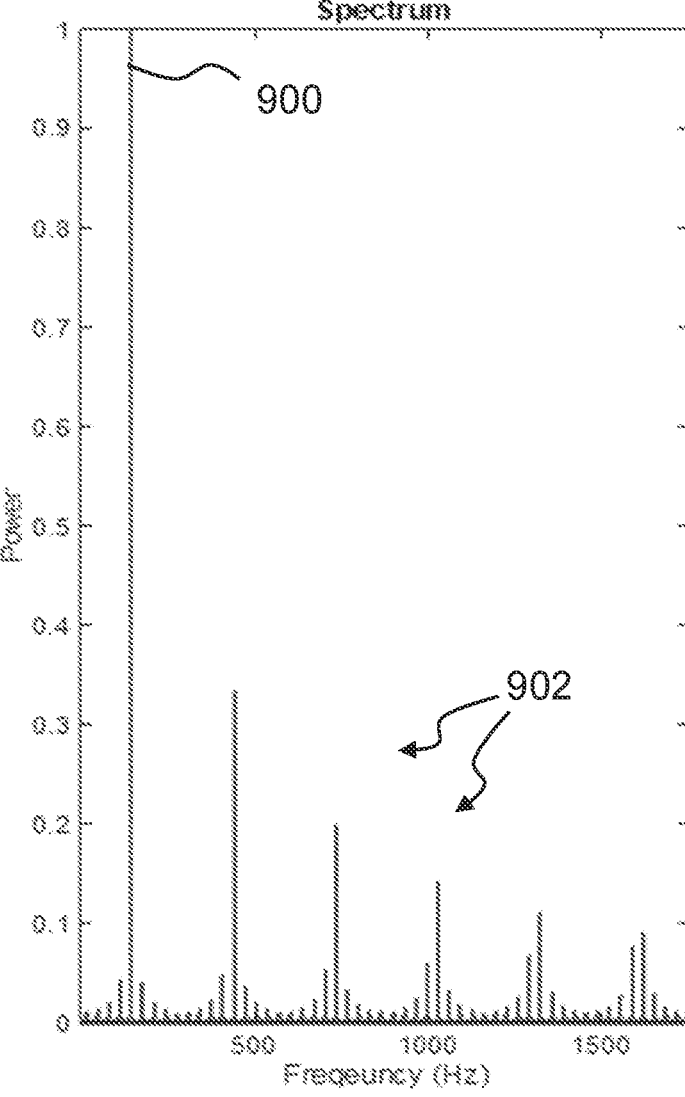
FIG. 9 is a frequency spectrum of a signal output from the ADC of FIG. 3.
Figure 10:
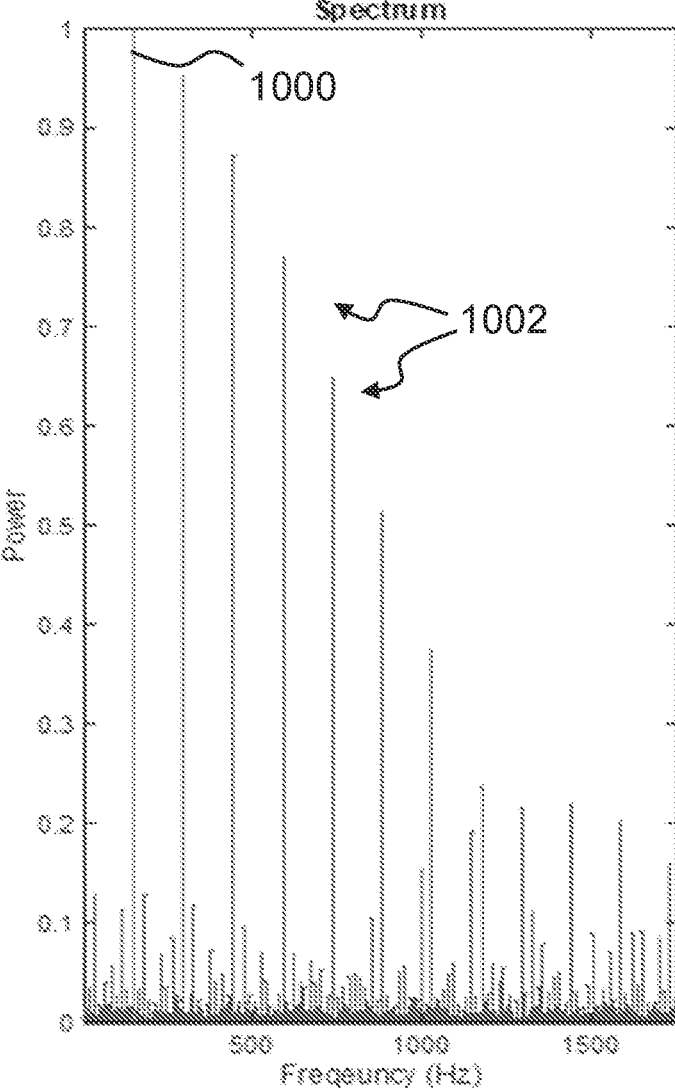
FIG. 10 is a frequency spectrum of a signal output from the ADC of FIG. 3.

FIGS. 9 and 10 illustrate this concept.

FIG. 9 shows a frequency spectrum of an output signal Q responsive to a square wave stimulus VSTIM with a duty cycle of 0.5. The output signal Q comprises a fundamental component 900 at around 200 Hz and second to sixth harmonics 902.

FIG. 10 shows a frequency spectrum of an output signal Q response to a square wave stimulus VSTIM with a duty cycle of 0.1. Over the same frequency range, the output signal Q comprises a fundamental component 1000 and second to twelfth harmonics 1002. Thus, it can be seen that the distribution and number of harmonics over a given bandwidth can be adjusted by adjusting the duty cycle of the stimulus VSTIM.

As noted above, FIG. 3 illustrates drive and measurement circuitry 300 for analysis of the electrochemical cell 100 which may be incorporated into an electrochemical sensor or the like. It will, however, be appreciated that embodiments of the present disclosure are not limited to such cells.

Figure 11:
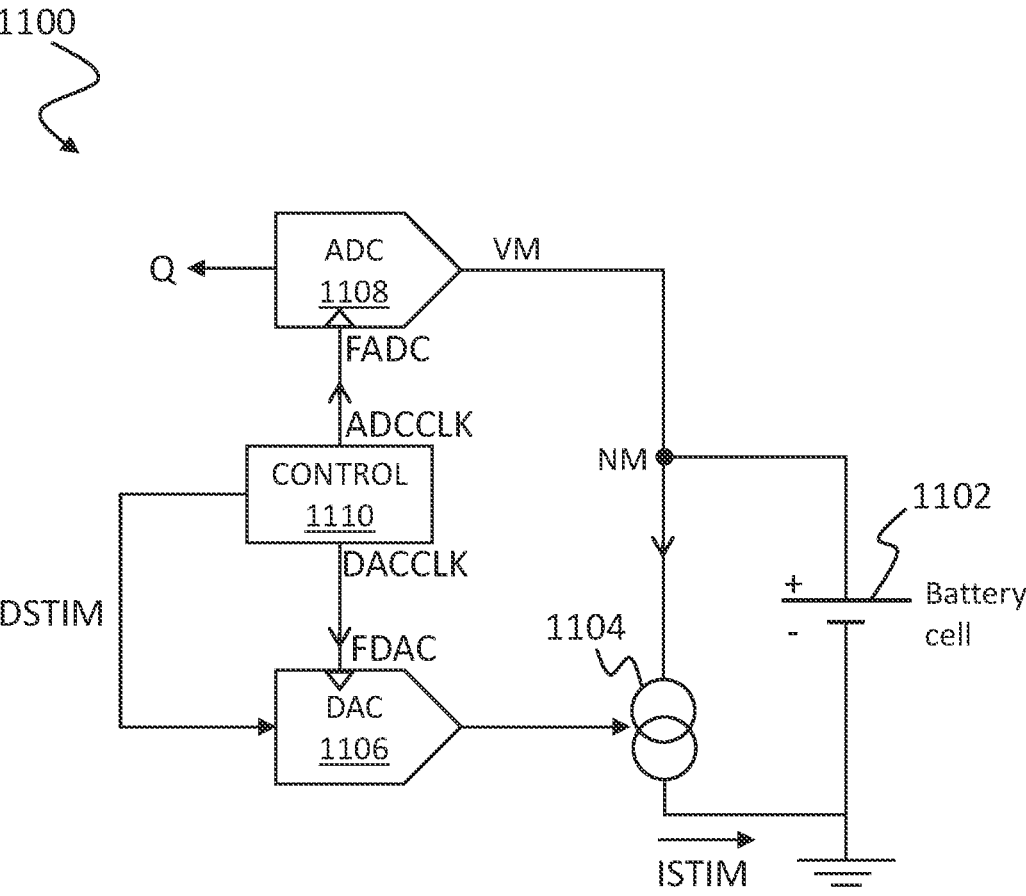
FIG. 11 is a schematic diagram of drive and measurement circuitry for characterising a battery cell.

FIG. 11 illustrates example drive and measurement circuitry 1100 according to embodiments of the present disclosure, for measuring a characteristic of a battery cell 1102 using electrochemical impedance spectroscopy (EIS). The circuitry 1100 comprises a voltage controlled current source 1104, a DAC 1106, an ADC 1108, and a control module 1110.

The control module 1110 is configured to generate a digital stimulus DSTIM, an ADC clock signal ADCCLK and a DAC clock signal DACCLK.

The voltage controlled current source 1104 is coupled between a cathode and an anode of the battery cell 1102 and configured to provide a stimulation current ISTIM to the battery cell 1102 via the anode. The anode of the battery cell 1102 is also coupled to a reference voltage (in this case ground).

The DAC 1106 is configured to convert the digital stimulation signal DSTIM received from the control module 1110 into an analog voltage VSTIM which is provided to the current source 1104. The stimulation current ISTIM provided by the current source 1104 is thus dependent on the analog voltage VSTIM (and in turn the digital stimulation signal DSTIM). The DAC 1106 is configured to sample the digital stimulation signal DSTIM at a sampling frequency FDAC which is equal to a frequency of a clock signal CLK provided to the circuitry 1100.

Responsive to the stimulation (or load) current ISTEM provided through the battery cell 1102, a voltage VM across the terminals of the battery cell 1102 (as measured at the measurement node NM) is provided to an input of the ADC 1108. The ADC 1108 in turn is configured to convert the voltage VM into a digital output signal Q which is proportional to the voltage drop across the battery cell 1102.

The ADC 1108 is configured to sample the measured voltage VM at a sampling frequency FADC, based on the ADC clock signal ADCCLK received from the control module 1110. The control module 1110 is configured to control the frequency of the ADC clock signal ADCCLK and the DAC clock signal DACCLK such that they differ by a factor k (where k is greater than 1). In other words, the frequency of the DAC clock signal DACCLK is higher than the frequency of the ADC clock signal ADCCLK. For example, the frequency FDAC of the DAC clock signal DACCLK provided to the DAC 1106 is a factor of k greater than the frequency FADC of the ADC clock signal ADC-CLK provided to the ADC 1108.

Thus, it will be appreciated that the principles of operation of the circuitry 300 described above apply equally to the circuitry 1100 of FIG. 11. For example, characteristics (e.g., frequency, amplitude, duty cycle etc.) of the current stimulus ISTIM may be controlled in a similar manner to the voltage stimulus VSTIM provided to the counter electrode CE of the electrochemical cell 100. For example, the relationship between the frequency FSTIM of the current stimulus ISTIM and the ADC sampling frequency FADC of the ADC 1108 may be controlled in a similar manner to that described above between the frequency FSTIM of the voltage stimulus VSTIM and the ADC sampling frequency FADC of the ADC 308.

The various circuitry and electrochemical cells described herein may be incorporated into a continuous analyte sensor or a continuous glucose sensor or a continuous glucose monitor. The terms "continuous analyte sensor", "continuous glucose sensor", and "continuous glucose monitor" as used herein, will be well-known to a person of ordinary skill in the art and are not to be limited to a special or customized meaning. These terms refer, without limitation, to a device that continuously measures a concentration of an analyte/glucose and/or calibrates the sensor or an electrochemical cell incorporated therein (e.g., by continuously adjusting or determining the sensor's sensitivity and background).

The various circuitry and electrochemical cells described herein may be incorporated into an electrical battery or system for characterising or monitoring a state of a battery, such as a battery monitor or a battery management system (BMS). The term "battery monitor" and "battery management system" are well known in the art and are not to be limited to a special or customized meaning.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general-purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for determining an impedance of an electrochemical cell comprising at least one first electrode and a second electrode, the circuitry comprising:

drive circuitry configured to apply a stimulus to the electrochemical cell, the stimulus having a stimulation frequency and a stimulation amplitude; and measurement circuitry configured to:

sample an output of the electrochemical cell at a sampling frequency to generate an output signal;

determine an output amplitude of output signal at one or more alias frequencies, the one or more alias frequency based on the stimulation frequency and the sampling frequency; and determine the impedance of the electrochemical cell at the stimulation frequency based on the output amplitude at the one or more alias frequencies and the stimulation amplitude; and control circuitry configured to:

control the sampling frequency and the stimulation frequency such that a Nyquist rate of the sampling frequency is less than stimulation frequency.

2. Circuitry of claim 1, wherein the drive circuitry comprises:

a digital-to-analog converter (DAC) configured to convert a digital input signal into the stimulus at a conversion frequency; and apply the stimulus at the second electrode of the electrochemical cell.

3. Circuitry of claim 2, wherein the measurement circuitry comprises:

an analog-to-digital converter (ADC) configured to sample the output of the electrochemical cell at the at least one first electrode.

4. Circuitry of claim 3, wherein DAC and the ADC are synchronised.

5. Circuitry of claim 4, wherein:

the DAC is clocked by a first clock signal at the conversion frequency;

the ADC is clocked by a second clock signal at the sampling frequency; and a first frequency of the first clock signal is an integer multiple of a second frequency of the second clock signal.

6. Circuitry of claim 1, wherein the stimulus comprises a square wave.

7. Circuitry of claim 2, wherein the control circuitry is configured to control the sampling frequency based on the digital input signal or the stimulus, or wherein the control circuitry is configured to control the digital input signal or the stimulus based on the sampling frequency.

8. Circuitry of claim 1, wherein the control circuitry is configured to control the stimulation frequency and the sampling frequency so as to reduce aliasing of one or more harmonic components of a digital output signal onto a fundamental component of the digital output signal.

9. Circuitry of claim 8, wherein the control circuitry is configured to vary the stimulation frequency and sampling frequency over time to reduce aliasing of the one or more harmonic components of the digital output signal onto the fundamental component of the digital output signal.

10. Circuitry of claim 1, wherein the control circuitry is configured to control the stimulation frequency and the sampling frequency to maintain a greatest common denominator of the stimulation frequency of an analog measurement stimulus and the sampling rate at approximately 1.

11. Circuitry of claim 1, wherein the control circuitry is configured to control the stimulation frequency and the sampling frequency to be approximately co-prime.

12. Circuitry of claim 1, wherein the control circuitry is configured to vary the stimulation frequency over a first range of frequencies below the Nyquist rate of the sampling frequency, wherein the measurement circuitry is configured to determine the output amplitude of the output signal at one or more frequencies unaffected by aliasing.

13. Circuitry of claim 1, wherein the control circuitry is configured to vary the stimulation frequency and the sampling frequency over time to minimize an impact of harmonic aliasing at a predefined aliasing frequency.

14. Circuitry of claim 1, wherein the at least one first electrode is a working electrode, and wherein the second electrode is a counter electrode.

15. Circuitry of claim 1, wherein the at least one first electrode comprises an anode and the second electrode comprises a cathode.

16. A system comprising:

the circuitry of claim 1; and the electrochemical cell.

17. An electronic device, comprising the circuitry of claim 1.

18. The electronic device of claim 17, wherein the device comprises one of an analyte monitor, a continuous glucose monitor, a battery, a battery monitor, a mobile computing device, a laptop computer, a tablet computer, a games console, a remote control device, a home automation controller or a domestic appliance, a toy, a robot, an audio player, a video player, or a mobile telephone, and a smartphone.

19. A method of determining an impedance of an electrochemical cell comprising at least one first electrode and a second electrode, the method comprising:

applying a stimulus to the electrochemical cell, the stimulus having a stimulation frequency and a stimulation amplitude;

sampling an output of the electrochemical cell at a sampling frequency and generate an output signal, a Nyquist rate of the sampling frequency being less than the stimulation frequency;

determining an output amplitude of output signal at one or more alias frequencies, the one or more alias frequency based on the stimulation frequency and the sampling frequency; and determining the impedance of the electrochemical cell at the stimulation frequency based on the output amplitude at the one or more alias frequencies and the stimulation amplitude.

* * * * *